(12) United States Patent
Zheng

(10) Patent No.: US 6,859,481 B2
(45) Date of Patent: *Feb. 22, 2005

(54) OPTICALLY-PUMPED MULTIPLE-QUANTUM WELL ACTIVE REGION WITH IMPROVED DISTRIBUTION OF OPTICAL PUMPING POWER

(75) Inventor: Jun Zheng, Houston, TX (US)

(73) Assignee: Applied Optoelectronics, Inc., Sugar Land, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 78 days.

(21) Appl. No.: 10/196,059

(22) Filed: Jul. 16, 2002

(65) Prior Publication Data

US 2004/0013154 A1 Jan. 22, 2004

(51) Int. Cl.[7] .............................. H01S 3/091; H01S 5/00
(52) U.S. Cl. .............................. 372/70; 372/45; 372/46; 372/75
(58) Field of Search .............................. 372/45, 46, 70, 372/75, 96, 50, 20; 257/17; 438/40, 21; 136/249; 437/129

(56) References Cited

U.S. PATENT DOCUMENTS

| | | | | |
|---|---|---|---|---|
| 5,068,867 A | * | 11/1991 | Hasenberg et al. | 372/45 |
| 5,225,692 A | * | 7/1993 | Takeuchi et al. | 257/17 |
| 5,416,790 A | * | 5/1995 | Yodoshi et al. | 372/46 |
| 5,600,667 A | * | 2/1997 | Kidoguchi et al. | 372/45 |
| 5,610,096 A | * | 3/1997 | Yodoshi et al. | 438/40 |
| 5,796,771 A | * | 8/1998 | DenBaars et al. | 372/75 |
| 5,812,578 A | * | 9/1998 | Schemmann et al. | 372/46 |
| 6,026,110 A | * | 2/2000 | Makino | 372/96 |
| 6,055,253 A | * | 4/2000 | Kidoguchi et al. | 372/45 |
| 6,141,364 A | * | 10/2000 | Adachi et al. | 372/45 |
| 6,285,702 B1 | | 9/2001 | Caprara et al. | |
| 6,327,293 B1 | | 12/2001 | Salokatve et al. | |
| 6,438,149 B1 | * | 8/2002 | Tayebati et al. | 372/45 |
| 6,503,768 B2 | * | 1/2003 | Cho et al. | 438/21 |
| 6,546,029 B2 | * | 4/2003 | Sirbu et al. | 372/20 |
| 6,567,434 B2 | * | 5/2003 | Spinelli et al. | 372/22 |
| 6,625,182 B1 | * | 9/2003 | Kuksenkov et al. | 372/19 |
| 6,628,695 B1 | * | 9/2003 | Aldaz et al. | 372/96 |
| 6,693,941 B1 | * | 2/2004 | Okazaki et al. | 372/75 |
| 6,735,234 B1 | * | 5/2004 | Paschotta et al. | 372/75 |

* cited by examiner

*Primary Examiner*—Minsun Oh Harvey
*Assistant Examiner*—James Menefee
(74) *Attorney, Agent, or Firm*—N. Stephan Kinsella (57) ABSTRACT

An optically-pumped (OP) multiple quantum well (MQW) active region is disposed in an optical cavity of an OP VCSEL, which generates laser light at a lasing wavelength. The OP VCSEL receives pump light at a first end of the optical cavity. A plurality of quantum well (QW) groups are equally spaced within the active region to correspond in position with antinodes of a standing wave of the lasing wavelength in the optical cavity. The QW groups include a first QW group that is closest to the first end of the optical cavity, and a last QW group that is farthest from the first end of the optical cavity. A plurality of equally thick intermediate absorbing layers are disposed between adjacent QW groups. A last absorbing layer is disposed adjacent to the side of the last QW group farthest away from the first end of the optical cavity. A first absorbing layer is disposed adjacent to the side of the first QW group closest to the first end of the optical cavity. The first absorbing layer has a thickness at least two times smaller than that of the intermediate absorbing layers, thereby leading to improved pump power distribution uniformity across QW groups of the active region.

46 Claims, 3 Drawing Sheets

FIG. 3 300 though the cavity of stimulated emission on each pass through the active region. Thus, photons reflecting in the cavity

OPTICALLY-PUMPED MULTIPLE-QUANTUM WELL ACTIVE REGION WITH IMPROVED DISTRIBUTION OF OPTICAL PUMPING POWER

BACKGROUND OF THE INVENTION

1. Field of the Invention

This invention relates to vertical-cavity surface-emitting lasers (VCSELs) and, in particular, to optically-pumped multiple-quantum well (MQW) active regions for devices such as OP VCSELs.

2. Description of the Related Art

The following descriptions and examples are not admitted to be prior art by virtue of their inclusion within this section.

There are several types of lasers, including gas lasers, solid-state lasers, liquid (dye) lasers, free electron lasers, and semiconductor lasers. All lasers have a laser cavity defined by at least two laser cavity mirrors, and an optical gain medium in the laser cavity. The gain medium amplifies electromagnetic waves (light) in the cavity by stimulated emission, thereby providing optical gain.

In semiconductor lasers, a semiconductor active region serves as the optical gain medium. Semiconductor lasers may be diode (bipolar) lasers or non-diode, unipolar lasers such as quantum cascade (QC) lasers. Semiconductor lasers are used for a variety of industrial and scientific applications and can be built with a variety of structures and semiconductor materials.

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

The optical gain of a laser is a measure of how well a gain medium such as an active region amplifies photons by stimulated emission. The primary function of the active region in a semiconductor laser is to provide sufficient laser gain to permit lasing to occur. The active region may employ various materials and structures to provide a suitable collection of atoms or molecules capable of undergoing stimulated emission at a given lasing wavelength, so as to amplify light at this wavelength. The active region may comprise, for example, a superlattice structure, or a single- or multiple-quantum well (MQW) structure.

Amplification by stimulated emission in the active region of a semiconductor laser is described as follows. The semiconductor active region contains some electrons at a higher, excited state or energy level, and some at a lower, resting (ground) state or energy level. The number and percentage of excited electrons can be increased by pumping the active region with a pumping energy, from some energy source such as an electrical current or optical pump. Excited electrons spontaneously fall to a lower state, "recombining" with a hole. The recombination may be either radiative or non-radiative. When radiative recombination occurs, a photon is emitted with the same energy as the difference in energy between the hole and electron energy states.

Stimulated emission, as opposed to spontaneous emission, occurs when radiative recombination of an electron-hole pair is stimulated by interaction with a photon. In particular, stimulated emission occurs when a photon with an energy equal to the difference between an electron's energy and a lower energy interacts with the electron. In this case, the photon stimulates the electron to fall into the lower energy state, thereby emitting a second photon. The second photon has the unique property that it has the same energy, frequency, and phase as the original photon. Thus, when the photons produced by spontaneous (or stimulated) emission interact with other high energy state electrons, stimulated emission can occur so that two photons with identical characteristics are present. (Viewed as waves, the atom emits a wave having twice the amplitude as that of the original photon interacting with the atom.) I.e., one photon of a given energy, frequency, and phase produces a second photon of the same energy, frequency, and phase; and these two photons may each, if not absorbed, stimulate further photon emissions, some of which can themselves stimulate further emissions, and so on.

Amplification by stimulated emission requires that more photons be produced by stimulated emission than are absorbed by lower-state electrons. This condition, known as population inversion, occurs when there are more excited (upper lasing level) electrons than ground-state (lower lasing level) electrons. If there were more lower state than upper state electrons, then more photons would be absorbed by the lower energy electrons (causing upward excitations) than would be produced by stimulated emission. When there is a population inversion, however, enough electrons are in the excited state so as to prevent absorption by ground-state electrons from sabotaging the amplification process. Thus, when population inversion is achieved, stimulated emission predominates over stimulated absorption, thus producing amplication of light (optical gain). If there is population inversion, lasing is therefore possible, if other necessary conditions are also present.

Population inversion is achieved by applying a sufficient pumping energy to the active region, to raise a sufficient number of electrons to the excited state. Various forms of pumping energy may be utilized to excite electrons in the active region and to achieve population inversion and lasing. For example, semiconductor lasers of various types may be electrically pumped (EP), by a DC or alternating current. Optical pumping (OP) or other pumping methods, such as electron beam pumping, may also be used. EP semiconductor lasers are typically powered by applying an electrical potential difference across the active region, which causes a current to flow therein. As a result of the potential applied, charge carriers (electrons and holes) are injected from opposite directions into an active region. This gives rise to an increase in spontaneous generation of photons, and also increases the number of excited state electrons so as to achieve population inversion. Thus, in electrical pumping, carriers injected across electrical semiconductor junctions recombine in active layers and thereby generate laser radiation.

In OP lasers, an external laser beam or other light is directed into the active region, where the light is absorbed, thus generating carriers, some of which recombine to emit radiation at the desired wavelength in the quantum wells.

In a semiconductor laser, an active region is sandwiched between the cavity mirrors, and pumped with a pumping energy to cause population inversion. Photons are spontaneously emitted in the active region. Some of those photons travel in a direction perpendicular to the reflectors of the laser cavity. As a result of the ensuing reflections, the photons travel through the active region multiple times, being amplified by stimulated emission on each pass through the active region. Thus, photons reflecting in the cavity experience gain when they pass through the active region. However, loss is also experienced in the cavity, for example by extraction of the output laser beam, which can be about 1% of the coherent cavity light, by absorption or scattering caused by less than perfect (100%) reflectance (reflectivity) of the cavity mirrors, and other causes of loss.

Therefore, for lasing to occur, there must be not only gain (amplification by stimulated emission) in the active region, but enough gain to overcome all losses in the laser cavity as well as allow an output beam to be extracted, while still allowing laser action to continue. The minimum gain provided the active region that will permit lasing, given the cavity losses, is the threshold lasing gain of the laser medium.

The gain of a semiconductor wavelength varies depending on the wavelength of light. When the active region provides the threshold lasing gain over a given wavelength range, there will be a sufficient amount of radiative recombinations stimulated by photons, so that the number of photons traveling between the reflectors tends to increase, giving rise to amplification of light and lasing. This causes coherent light to build up in the resonant cavity formed by the two mirrors, a portion of which passes through one of the mirrors (the "exit" mirror) as the output laser beam.

Because a coherent beam makes multiple passes through the optical cavity, an interference-induced longitudinal mode structure or wave is observed. The wave along the laser cavity is a standing EM wave and the cavity of effective optical length L only resonates when the effective optical path difference between the reflected wavefronts is an integral number of whole wavelengths (the effective cavity length or optical path difference takes phase-shifting effects at the mirrors into account). In other words, lasing is only possible at wavelengths for which the round-trip phase is a multiple of $2\pi$. The set of possible wavelengths that satisfy the standing wave condition is termed the set of longitudinal modes of the cavity. Although there are an infinite number of such wavelengths, only a finite number of these fall within the wavelength range over which the gain spectrum of the active region exceeds the threshold lasing gain. The laser will lase only at one or more of the possible longitudinal (wavelength) modes which fit into this wavelength range.

Semiconductor lasers may be edge-emitting lasers or surface-emitting lasers (SELs). Edge-emitting semiconductor lasers output their radiation parallel to the wafer surface, in contrast to SELs, in which the radiation output is perpendicular to the wafer surface, as the name implies. The most common type of SEL is the vertical-cavity surface-emitting laser (VCSEL). Both EP and OP VCSEL designs are possible. The "vertical" direction in a VCSEL is the direction perpendicular to the plane of the substrate on which the constituent layers are deposited or epitaxially grown, with "up" being typically defined as the direction of epitaxial growth. In some designs, the output laser beam is emitted out of the top side, in which case the top mirror is the exit mirror. In other designs, the laser beam is emitted from the bottom side, in which case the bottom mirror is the exit mirror. The exit mirror typically has slightly lower reflectivity than the other ("backside") mirror.

VCSELs have many attractive features compared to edge-emitting lasers, such as low threshold current, single longitudinal mode, a circular output beam profile, scalability to monolithic laser arrays, and ease of fiber coupling. The shorter cavity resonator of the VCSEL provides for better longitudinal mode selectivity, and hence narrower linewidths. Because of their short cavity lengths, VCSELs have inherent single-frequency operation. Additionally, because the output is perpendicular to the wafer surface, it is possible to test fabricated VCSELs on the wafer before extensive packaging is done (wafer scale probing), in contrast to edge-emitting lasers, which must be cut from the wafer to test the laser. Also, because the cavity resonator of the VCSEL is perpendicular to the layers, there is no need for the cleaving operation common to edge-emitting lasers.

The VCSEL structure usually consists of an active (optical gain) region or layer sandwiched between two mirrors, such as distributed Bragg reflector (DBR) mirrors. DBRs are typically formed of multiple pairs of layers referred to as mirror pairs; DBRs are sometimes referred to as mirror stacks. The DBR mirrors of a typical VCSEL can be constructed from dielectric (insulating) or semiconductor layers (or a combination of both, including metal mirror sections). The pairs of layers are formed of a material system generally consisting of two materials having different indices of refraction, i.e. the DBR comprises alternating layers of high and low indexes of refraction. For semiconductor DBRs, the layers are typically selected so that they are easily lattice matched to the other portions of the VCSEL, to permit epitaxial fabrication thereof.

The two mirrors may be referred to as a top DBR and a bottom DBR; the top DBR often serves as the exit mirror. Because the optical gain is low in a vertical cavity design compared to an edge-emitting laser (because the photons in the cavity pass through the active region for a smaller percentage of the round-trip optical path), the reflectors require a high reflectivity in order to achieve a sufficient level of feedback for the device to lase.

For semiconductor DBRs, the number of mirror pairs per stack may range from 20–40 pairs to achieve a high percentage of reflectivity, depending on the difference between the refractive indices of the layers. A larger number of mirror pairs increases the percentage of reflected light (reflectivity). The difference between the refractive indices of the layers of the mirror pairs can be higher in dielectric DBRs, generally imparting higher reflectivity to dielectric DBRs than to semiconductor DBRs for the same number of mirror pairs and DBR thickness. Conversely, in a dielectric DBR, a smaller number of mirror pairs can achieve the same reflectivity as a larger number in a semiconductor DBR. However, it is sometimes necessary or desirable to use semiconductor DBRs, despite their lower reflectivity/greater thickness, to conduct current, for example (e.g., in an EP VCSEL). Semiconductor DBRs also have higher thermal (heat) conductivity than do dielectric DBRs, making them more desirable for heat-removal purposes, other things being equal. Semiconductor DBRs may also be preferred for manufacturing reasons (e.g., a thicker DBR may be needed for support) or fabrication reasons (e.g., an epitaxial, i.e. semiconductor, DBR may be needed if other epitaxial layers need to be grown on top of the DBR).

When properly designed, these mirror pairs will cause a desired reflectivity at the laser wavelength. VCSEL mirrors are typically designed so that the bottom (backside) DBR mirror (i.e. the one interposed between the substrate material and the active region) has nearly 100% reflectivity, while the top (exit) DBR mirror has a reflectivity that may be 98%–99.5% (depending on the details of the laser design). The partially reflective top mirror passes a portion of the coherent light built up in the resonating cavity formed by the active region and top and bottom mirrors. Of course, as noted above, in other designs, the bottom mirror may serve as the exit mirror, with the top mirror having the higher reflectivity.

OP VCSELs are typically pumped by a high-power edge-emitting diode pump laser. This makes it possible to achieve high single-transverse-mode output power for both long and short-wavelength lasers. Also, unlike EP VCSELs, OP VCSELs do not need electrical contacts, doping of the semiconductor material, or current confinement structures, which can make manufacturing simpler and less costly. Additionally, since no current needs to pass through the DBRs, they can be undoped which reduces the optical losses in the lasing cavity, compared to EP VCSEL designs having doped DBR and other epi layers. Moreover, self-heating is reduced by optically pumping to inject carriers directly into the active region, resulting in increased output power and operating temperature.

The "top" mirror of an OP VCSEL may be a DBR mirror integrated with the laser structure, or mounted external to the monolithic structure, forming an external cavity. VCSELs employing external cavity mirrors are sometimes referred to as vertical external-cavity surface-emitting lasers (VECSELs), but are referred to herein as VCSELs for simplicity. Such an external cavity can be used for frequency doubling or absorption spectroscopy, for example.

The active region of OP VCSELs typically employs an MQW structure having a plurality of quantum wells (QWs) having separator layers between successive ones thereof. The QW layers are typically very thin, e.g. on the order of 100–150 Å, and are spaced apart by separator layers composed of a semiconductor material having a higher conducting band energy than that of the QW layers. The separator layers are also referred to as absorbing layers, because they absorb the pump radiation provided by the pump laser. The absorbing layers have a higher conduction band energy that the QW layers. The active or QW layers and separator/absorbing layers together constitute the gain structure of an OP laser.

In an OP VCSEL, pump energy in the form of light (radiation) is typically directed into the active region, typically through a "top" side of the active region layers, where it is absorbed by the separator layers, thereby raising existing electrons to higher energy states or levels. (For a defined cavity, the pump light is directed into the cavity; where a wafer having no mesas or other definition of cavities is provided, the direction of pump light into a location of a wafer generates and defines a cavity.) Raising the existing electrons to higher energy states generates electrical carriers (holes and electrons), which relax or "fall" into neighboring quantum wells where they are "trapped," thus creating a large concentration of electrical carriers in the QW layers. Carrier recombination in the QW lawyers generates electromagnetic radiation at the fundamental wavelength. The QW layers are typically arranged so that they are spaced apart by one half-wavelength of the fundamental lasing wavelength, and so that they correspond in position with antinodes of the standing wave of the fundamental laser radiation that exists in the laser cavity when lasing is occuring.

The pumping light passes through successive separator layers, each of which absorbs some of the light passing through it. Therefore, the quantum wells and separator layers closer to the light source (e.g., those at the top of the active layer) absorb a relatively larger percentage of the light, and thus have a relatively larger amount of recombinations, than those farther away (e.g., near the bottom of the active region). For example, for an active region having 4 QWs, each at an antinode, the first may receive carriers due to absorption of about 40–50% of the optical pumping light, with each succeeding QW having diminishing amounts of recombination due to the declining percentage of light remaining to be absorbed in the vicinity of each QW. Such a nonuniform distribution of optical pumping power leads to lower maximum output power and/or inefficient use of some of the QWs, e.g. those having comparatively smaller amounts of carrier recombination.

There is, therefore, a need for improved OP VCSEL and MQW active region techniques and structures having more uniform absorption of pumping power.

BRIEF DESCRIPTION OF THE DRAWINGS

Other features and advantages of the invention will become apparent upon study of the following description, taken in conjunction with the attached FIGS. 1–3.

DETAILED DESCRIPTION OF THE INVENTION

The present invention provides a method and MQW active region structure having an optical pumping power distribution that is more uniform than that of conventional MQW active regions, for use in devices such as OP VCSELs. In an embodiment, the OP VCSEL of the present invention comprises an MQW active region comprising a plurality of quantum well (QW) groups, each QW group having one or more QWs. The QW groups are arranged within the longitudinal cavity so that they are spaced apart by one half-wavelength of the fundamental lasing wavelength, and so that they correspond in position with antinodes of the standing wave of the fundamental laser radiation that exists in the laser cavity when lasing is occuring. All neighboring or adjacent QW groups are separated by equally thick "intermediate" absorbing layers. A bottom absorbing layer disposed on the bottom side of the last (bottom) QW group is at least as thick as the intermediate absorbing layers. However, a first (top) absorbing layer (the first absorbing layer to absorb pump energy) disposed on the top side of the top QW group is several times thinner than the intermediate and bottom absorbing layers. This makes possible a more uniform distribution and absorption of pump energy across the QW groups.

The OP laser of the present invention may be utilized for various applications such as telecommunications applications. For example, the OP laser may be designed to emit at 1.31 $\mu$m or 1.55 $\mu$m wavelengths, where optical fibers have lower attenuation. Further details, advantages, applications, and embodiments of the invention are described below with reference to the Figures.

Figure 1:
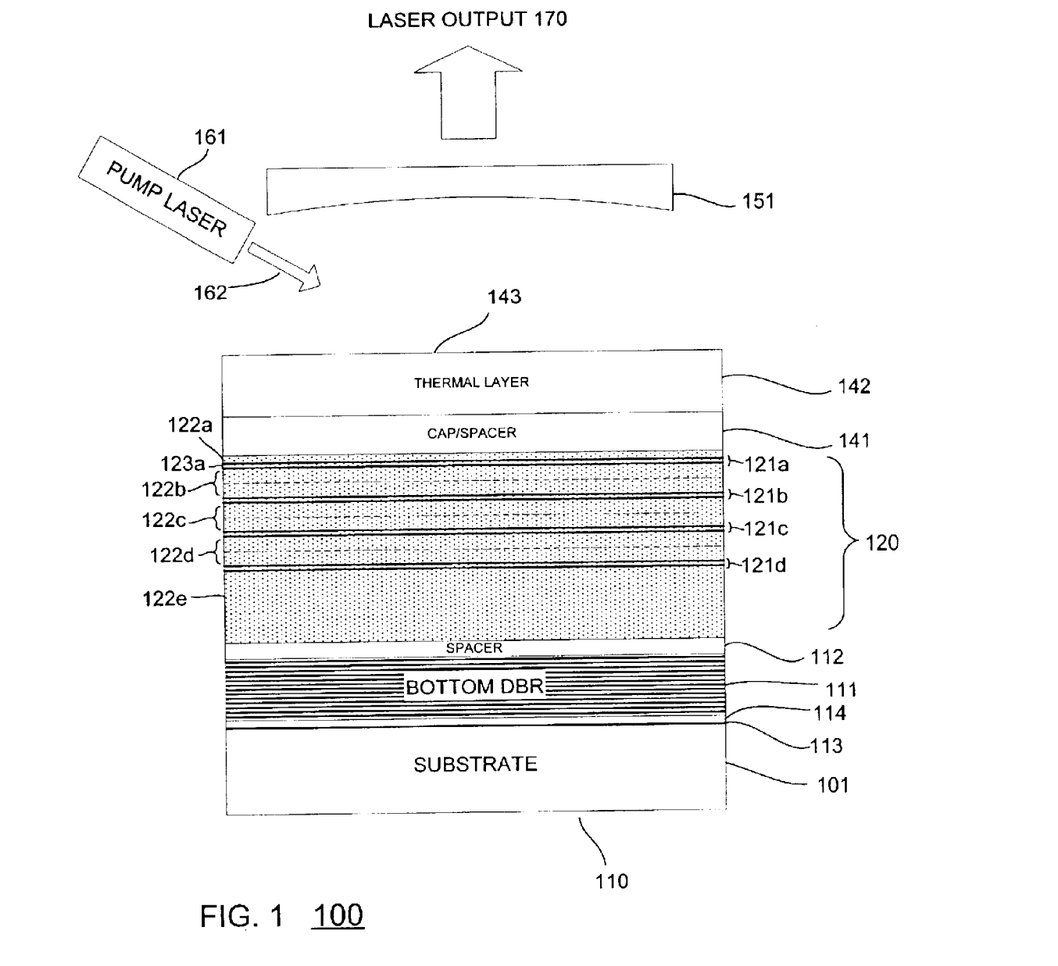
FIG. 1 is a cross-sectional view of the layer structure of an OP VCSEL having an MQW active region structure arranged to achieve a more uniform distribution of pumping power, in accordance with an embodiment of the present invention.

Referring now to FIG. 1, there is shown a cross-sectional view of the layer structure of an OP laser 100 having an MQW active region structure arranged to achieve a more uniform distribution (i.e., absorption) of pumping power, in accordance with an embodiment of the present invention. OP laser 100 comprises a monolitic portion 110, an external top cavity mirror 151, and an external pump laser 161. Pump laser 161 directs pump radiation 162 into a top surface of monolithic portion 110, "down" into active region 120. When lasing is achieved, a laser output beam 170 is emitted through the top mirror 151.

The monolithic portion of laser 100 comprises a support substrate 101, a bottom DBR 111, phase-matching layer 114, and metal mirror 113 (which together form the bottom cavity mirror), spacer layer 112, active region section 120, cap/spacer layer 141, and thermal layer 142, all disposed sequentially and in the order illustrated in FIG. 1. The layers of laser 100 as depicted in FIG. 1 are not necessarily drawn to scale. As will be appreciated and as described in further detail below with reference to Table 1, the direction of epitaxial growth during fabrication of laser 100, in an embodiment, proceeds downwards, that is, first thermal layer 142 is grown on an initial substrate (not shown), followed by growth of cap/spacer layer 141, the constituent layers of active region 120, spacer 112, and then bottom DBR 111 and phase-matching layer 114. This is a so-called "epi-down" fabrication process.

Active layer section 120 is an MQW-based active region comprising a plurality of QWs. These QWs are preferably grouped into QW groups 121a, 121b, 121c, 121d. A QW group may contain one or more QWs. In the embodiment illustrated in FIG. 1, each QW group contains a pair of QWs. The QW groups are arranged within the longitudinal cavity so that they are spaced apart by one half-wavelength of the fundamental lasing wavelength, and so that they substantially correspond in position with antinodes of the standing wave of the fundamental laser radiation that exists in the laser cavity when lasing is occuring. In the present invention, the term "quantum well" or "QW" denotes the QW layer, of the active region, that provides quantum wells. Thus, QW group 121a comprises two separate QW layers, each QW layer referred to herein as a QW.

Each QW group is adjacent on both its sides (top and bottom) to absorbing material 122 so that pump light absorbed in the absorbing layers near a QW group generates electrical carriers which fall into the nearby QW group to provide for increased carrier recombination. Accordingly, the QW groups 121a–d are separated and surrounded by absorbing layers 122a–122e. A very thin QW group barrier or separator layer also consisting of absorbing material 123 preferably separates and provides a barrier between the individual QWs of a given QW group, but is thin enough so that all the QWs of the group are essentially at the same antinode. The QW group barrier layers 123 are very thin compared to the absorbing layers 122a–e, so that each barrier layer 123 absorbs only a trivial amount of light compared to adjacent absorbing layers 122.

In an embodiment, OP laser 100 is designed to emit an output beam 170 having a lasing wavelength of about 1.55 $\mu$m, and the layers and elements of OP laser 100 have the following properties. Support substrate 101 consists of Si. Spacer layer 112, cap/spacer layer 141, and thermal layer 142 also consist of InP. Cap/spacer layer 141 and thermal layer 142 are therefore substantially transparent to the pump light 162 (980 nm, as described below) and also to the 1.55 $\mu$m lasing light.

Bottom DBR 111 is a DBR consisting of multiple mirror pairs, each pair having layers of semiconductor having a crystal lattice constant close to the original InP epitaxial growth substrate, where the two layers of each mirror pair have differing indices of refraction. In an embodiment, DBR mirror 111 has about 20 In$_x$Ga$_y$Al$_{1-x-y}$As/InP mirror pair layers. In an embodiment, the mirror pairs of DBR mirror 111 are In$_{0.527}$Ga$_{0.334}$Al$_{0.139}$As/InP mirror pairs, and the combined bottom cavity mirror comprising bottom DBR 111, phase-matching layer 114, and metal mirror 113 has a reflectance of about 99.9% or greater for light at the lasing wavelength. As will be appreciated, each layer of the mirror pairs of the DBR has a quarter-wave optical thickness (QWOT), for a given desired lasing wavelength (for this reason, DBRs are sometimes referred to as semiconductor quarterwave stacks). In another embodiment, InGaAsP/InP or other mirror pair layer materials may be employed.

The bandgap of a quaternary material, measured in eV, is typically specified in terms of the wavelength of light at which photons have the same energy as the bandgap. Thus, for example, a material having a bandgap equal to the energy of photons of a wavelength of 1.1 $\mu$m may be said to have a bandgap of 1.1 $\mu$m. In an embodiment, absorbing layers 122a–122e consist of a quaternary material such as In$_{0.82}$Ga$_{0.19}$As$_{0.395}$P$_{0.605}$, having a bandgap of about 1.18 $\mu$m. The thin QW group barrier layer 123i between QWs of a given QW group 121i consist of the same absorbing material as absorbing layers 122a–122e, in an embodiment.

The elliptical cross-section laser pump beam 162 is preferably focused onto the chip surface 143 at an angle of about 45°, preferably oriented to result in a substantially round spot on substantially planar surface 143, thus giving rise to a substantially circular profile active region and output beam 170. Surface 143 of the transparent thermal layer 142 is preferably polished in order to minimize scattering of the pump light 162 and, hence, maximize the amount of power reaching the active region 120. Pump laser 161 may be a high-power CW 980 nm edge-emitting diode pump laser, with a focused spot size on surface 143 of about 60 $\mu$m in diameter. Pump laser 161 may typically emit a pump beam 162 having power on the order of about 400 mW, to generate a laser output beam 170 having a power on the order of about 10 mW at room temperature. The top, or external, mirror 151 has a reflectance of about 99% for light at the lasing wavelength. In an embodiment, lasing is possible when pump beam 162 has power greater than about 100 mW, i.e. the lasing threshold occurs at a pump power of about 100 mW.

In active region 120, the first or top QW group 121a is the group closest to the pump laser 161, and farthest from the bottom support substrate 110, i.e. it is closest to the surface 143 of the laser structure that receives the laser pump light 162. The last or bottom QW group is the group farthest from the pump laser and closest to the support substrate 101. The other QW groups 121b–c are intermediate (between) the top and bottom QW groups 121a, 121d. Each QW group 121i is adjacent, on its top and bottom sides, to absorbing material 122 that absorbs pump light and generates carriers that can be absorbed in the QWs of that QW group 121i. Neighboring QW groups (i.e., groups 121a and 121b; 121b and 121c; and 121c and 121d) are separated by intermediate absorbing layers, to-wit, layers 122b, 122c, and 122d, respectively.

Top QW group 121a also is adjacent, on its top side, to a first (top) or initial absorbing layer 122a, which is the first absorbing layer to absorb pump energy from pump laser 161. Conversely, the bottom QW group 121d also is adjacent, on its bottom side, to a last (bottom) absorbing layer 122e, which is the last absorbing layer 122 to absorb pump energy and contribute to recombination in a QW group of the MQW structure.

As noted above, a very thin QW group barrier layer 123i consisting of absorbing material preferably separates the individual QWs of a given QW group 121i but is thin enough so that all the QWs of the group are essentially at the same antinode. For example, the two QWs of top QW group 121a are separated by very thin absorbing material layer 123a and are thus very close to each other and both disposed essentially at the same antinode. Whether each QW group 121 comprises one QW or a plurality of QWs, it may be viewed as a single QW at the antinode having the combined QW characteristics of its constituent QWs, and receiving carriers due to absorption from the absorbing material adjacent to both top and bottom sides of the QW group.

In an embodiment, neighboring QW groups are separated by equally thick intermediate absorbing layers 122b–d. This maintains an equal spacing between QW groups and is a necessary requirement if the QW groups are to be positioned at antinodes and as closely as possible to each other. However, the top absorbing layer 122a, adjacent to the top side of the top QW group 121a, is significantly thinner than the intermediate absorbing layers 122b–d and the last (bottom) absorbing layer 122e. For example, in an embodiment, top absorbing layer is about one-fifth the thickness of the other absorbing layers 122b–e. Additionally, bottom absorbing layer, in an embodiment, is thicker than the intermediate layers 122b–d. This gives rise to a more uniform distribution and absorption of pump energy across the QW groups than if top absorbing layer 122a were the same order of thickness as the other absorbing layers, as described in further detail below with reference to Tables 1 and 2.

In general, the first absorbing layer of the active region of the present invention has a thickness at least two times thinner than that of the intermediate absorbing layers, and preferably, at least two times thinner than all other absorbing layers, that is, the intermediate absorbing layers and the last absorbing layer. In alternative embodiments, the first absorbing layer has a thickness at least four times thinner than that of the intermediate absorbing layers, or, alternatively, at least four times thinner than that of all other absorbing layers of the active region.

In operation, pump light 162 travels through substantially transparent layers 142 and 141, where it enters the first (top) absorbing layer 122a, which absorbs some of the light, to generate carriers. Substantially all of these carriers fall into the first QW group 121a, which is the only QW group adjacent to this absorbing layer. The remainder of the light (the light not absorbed in absorbing layer 122a) passes through QW group 121a. An insignificant amount of light is absorbed in the thin QW group barrier layer 123a, and additional light is absorbed in the intermediate absorbing layer 122b.

Unlike first absorbing layer 122a, intermediate absorbing layer 122b is adjacent to (because it is between) two QW groups, namely QW groups 121a and 121b. Therefore, some of the carriers generated in intermediate absorbing layer 122b will migrate towards QW group 121a and some towards QW group 121b. In general, carriers will tend to migrate toward the nearest QW group. Thus, each intermediate absorbing layer 122b–d may be divided into two portions of approximately equal thickness, as indicated by the horizontal dashed lines on intermediate absorbing layers 122b–d in FIG. 1. The "upper half" of each intermediate absorbing layer may be considered to contribute carriers due to absorption to the QW group adjacent to the upper side of the intermediate absorbing layer, while the lower half of the intermediate absorbing layer may be viewed as contributing carriers due to absorption to the QW group adjacent to the bottom side of the intermediate absorbing layer. Thus, for example, the "half" of absorbing layer 122b "above" the dashed line may be viewed as contributing carriers to QW group 121a, while the lower half of absorbing layer 122b may be viewed as contributing carriers to QW group 121b. In this manner, each QW group is adjacent on its top side and bottom side to an absorbing layer, either the first absorbing layer 122a, the last absorbing layer 122e, or the nearest and adjacent "half" of an adjacent absorbing layer 122b–d.

After the pump light passes through intermediate absorbing layer 122b, where some of it absorbed, contributing carriers to the adjacent QW groups 121a, 121b, the remainder of the light passes through the next intermediate absorbing layer, layer 122c. As noted above, intermediate absorbing layers 122b–d are the same thickness, so that the QW groups are to positioned at all the antinodes in the cavity; otherwise, if intermediate absorbing layers 122b–d were not the same thickness, there would be some antinodes between some QW groups at which there was not an antinode, which is inefficient. Because intermediate absorbing layers 122b–d are the same thickness, those farther away from pump laser 161 (i.e., those layers closer to the support substrate 110) absorb a smaller percentage of the original light 161, and thus generate a smaller amount of carriers for recombination, than those absorbing layers closer to surface 143. For example, if the intermediate absorbing layers all have a length and optical absorption so that each will absorb about ⅓ of the light incident on it, then absorbing layer 122c absorbs light having only ⅔ the intensity of the light incident on absorbing layer 122b. Thus, QW layers closer to the surface 143 tend to receive more carriers for recombination than those close to substrate 101, and therefore have a higher gain.

Although it is not possible to eliminate this nonuniformity of light absorption, the present invention reduces this nonuniformity by providing an initial absorbing layer 122a which is significantly thinner than the intermediate absorbing layers 122b–d and the last (bottom) absorbing layer 122e. This reduces the absorption nonuniformity between the first and second QW groups 121a and 121b, and the overall nonuniformity of absorption across all the active region's QW groups 121a–d. By more evenly distributing the carriers due to absorption across the QW groups, various advantages are obtained, such as reduced threshold power and increased maximum output power and linearity (the range over which an increase in input power results in substantially linear increase in output power).

Table 1 below illustrates the layer structure of an embodiment of OP VCSEL 100 of FIG. 1, at an initial stage of fabrication.

TABLE 1

| Layer # | Layer Name | Materials | Thickness (Å) | Nominal thickness |
|---|---|---|---|---|
| 114 | Phase | InP | 823.6 | |
| 111 | DBR | $In_{0.527}Ga_{0.334}Al_{0.139}As$/InP pairs | 1122/1124 (×24 pairs) | ($\lambda$/4 × 2)/pair × 24 pairs = $\lambda$/4 × 48 = 12$\lambda$ |
| 112 | Spacer | InP | 612 | $\lambda$/8 |
| 122e | Absorbing | $In_{0.82}Ga_{0.19}As_{0.395}P_{0.605}$ (1.18 $\mu$m) | 584.7 | $\lambda$/8 |

TABLE 1-continued

| Layer # | Layer Name | Materials | Thickness (Å) | Nominal thickness |
|---|---|---|---|---|
| 122e | Absorbing | $In_{0.82}Ga_{0.19}As_{0.395}P_{0.605}$ (1.18 μm) | 1169.4 | $\lambda/4$ |
| 122e | Absorbing | $In_{0.82}Ga_{0.19}As_{0.395}P_{0.605}$ (1.18 μm) | 1169.4 | $\lambda/4$ |
| 122e | Absorbing | $In_{0.82}Ga_{0.19}As_{0.395}P_{0.605}$ (1.18 μm) | 1007.0 | $17\lambda/8$ |
| 121d | QW4B | $In_{0.72}Ga_{0.28}AsP$ QW (~0.8% str) | 80.0 | |
| 123d | Barrier | $In_{0.82}Ga_{0.18}AsP$ (~0.5% t. str) | 150.0 | |
| 121d | QW4A | $In_{0.72}Ga_{0.28}AsP$ QW (~0.8% str) | 80.0 | |
| 122d | Absorbing | $In_{0.82}Ga_{0.19}As_{0.395}P_{0.605}$ (1.18 μm) | 2014.0 | |
| 121c | QW3B | $In_{0.72}Ga_{0.28}AsP$ QW (~0.8% str) | 80.0 | |
| 123c | Barrier | $In_{0.82}Ga_{0.18}AsP$ (~0.5% t. str) | 150.0 | |
| 121c | QW3A | $In_{0.72}Ga_{0.28}AsP$ QW (~0.8% str) | 80.0 | |
| 122c | Absorbing | $In_{0.82}Ga_{0.19}As_{0.395}P_{0.605}$ (1.18 μm) | 2014.0 | |
| 121b | QW2B | $In_{0.72}Ga_{0.28}AsP$ QW (~0.8% str) | 80.0 | |
| 123b | Barrier | $In_{0.82}Ga_{0.18}AsP$ (~0.5% t. str) | 150.0 | |
| 121b | QW2A | $In_{0.72}Ga_{0.28}AsP$ QW (~0.8% str) | 80.0 | |
| 122b | Absorbing | $In_{0.82}Ga_{0.19}As_{0.395}P_{0.605}$ (1.18 μm) | 2014.0 | |
| 121a | QW1B | $In_{0.72}Ga_{0.28}AsP$ QW (~0.8% str) | 80.0 | |
| 123a | Barrier | $In_{0.82}Ga_{0.18}AsP$ (~0.5% t. str) | 150.0 | |
| 121a | QW1A | $In_{0.72}Ga_{0.28}AsP$ QW (~0.8% str) | 80.0 | |
| 122a | Absorbing | $In_{0.82}Ga_{0.19}As_{0.395}P_{0.605}$ (1.18 μm) | 422.3 | |
| 141 | Spacer | InP | 1836 | $3\lambda/8$ |
| 141 | Cap | InP | 2448 | $\lambda/2$ |
| 142 | Thermal | InP | 19584 | $4\lambda$ |
| 453 | Etch stop | $In_{0.53}Ga_{0.47}As$ | 3000 | |
| 452 | Buffer | InP | 3000 | |
| 451 | Substrate | InP | large | |

As seen in Table 1, growth proceeds upwards, starting on initial epitaxial growth substrate 451. A buffer layer 452 and an $In_{0.53}Ga_{0.47}As$ layer 553 are grown on substrate 451. The epi layers shown in FIG. 1, namely thermal layer 142, followed by cap/spacer layers 141, and so on, to DBR 111 and phase-matching layer 114, are then epitaxially grown on growth on etch-stop layer 453. A $SiO_2$ barrier layer (not shown) is then deposited on phase-matching layer 114, and a metal layer (not shown) is deposited on the $SiO_2$ barrier layer, to form metal mirror 113 of FIG. 1. The $SiO_2$ barrier layer serves to prevent metal from metal mirror 113 from diffusing into InP phase-matching layer 114. Metal mirror 113 is formed of a metal such as silver, gold, copper or aluminum, or some layered combination of these and/or other metals, in an embodiment. Substrate 451 and layers 452–453 are removed after the epitaxial growth steps are completed, and the remaining sample is then flip-chip mounted onto support substrate 101 of FIG. 1, with the metal mirror 113 being down and the thermal layer 142 being up.

As can be seen from the embodiment illustrated in Table 1, the intermediate absorbing layers 122b–d have the same thickness (2014.0 Å). The final absorbing layer 122e is about 3930.5 Å, i.e. about twice as thick as intermediate absorbing layers 122b–d. However, the only absorbing material seen by pump light 162 before passing through first QW group 121a is initial absorbing layer 122a, which has a thickness of only 422.3 Å, in the embodiment shown in Table 1. This is less than one-fourth the thickness of the intermediate absorbing layers, and about one-tenth the thickness of the last absorbing layer. Thus, the initial absorbing layer 122a is significantly thinner than all other absorbing layers, including the next absorbing layer, namely the first intermediate absorbing layer 122b.

There exists a class of superlattice structures referred to as "strained-compensating" superlattices, sometimes referred to as "strained-layer" superlattices (SLS). These structures are formed by layers of materials having lattice constants that are alternately smaller and larger than that of the substrate upon which they are grown. The layers with smaller lattice constant are said to be in tension while the layers with larger lattice constant remain in compression. However, the net cumulative strain in the layer stack can be balanced so that the structure becomes pseudomorphically latticed-matched to the substrate. The physics of these types of structures is discussed in further detail in *Semiconductors and Semimetals*, vol. 32: *Strained Layer Superlattices: Physics*, R. K. Willardson & Albert C. Beer, eds. (New York: Academic Press, 1990), esp. ch. 1. In an embodiment, as shown in Table 1, each QW group has a pair of QW layers, each comprising a (compressively) strained superlattice, where the QW layers of the QW group 121i are separated by a barrier layer 123i, which is a superlattice under tensile strain. In an embodiment, for example, the QW layers have a compressive strain of about 0.8%, and the barrier layers have a tensile strain of about 0.5%. Thus, the compressive strain of the QW layers is somewhat compensated for by the tensile strain of the separating barrier layers, helping to reduce strain buildup in the active region.

Figure 2:
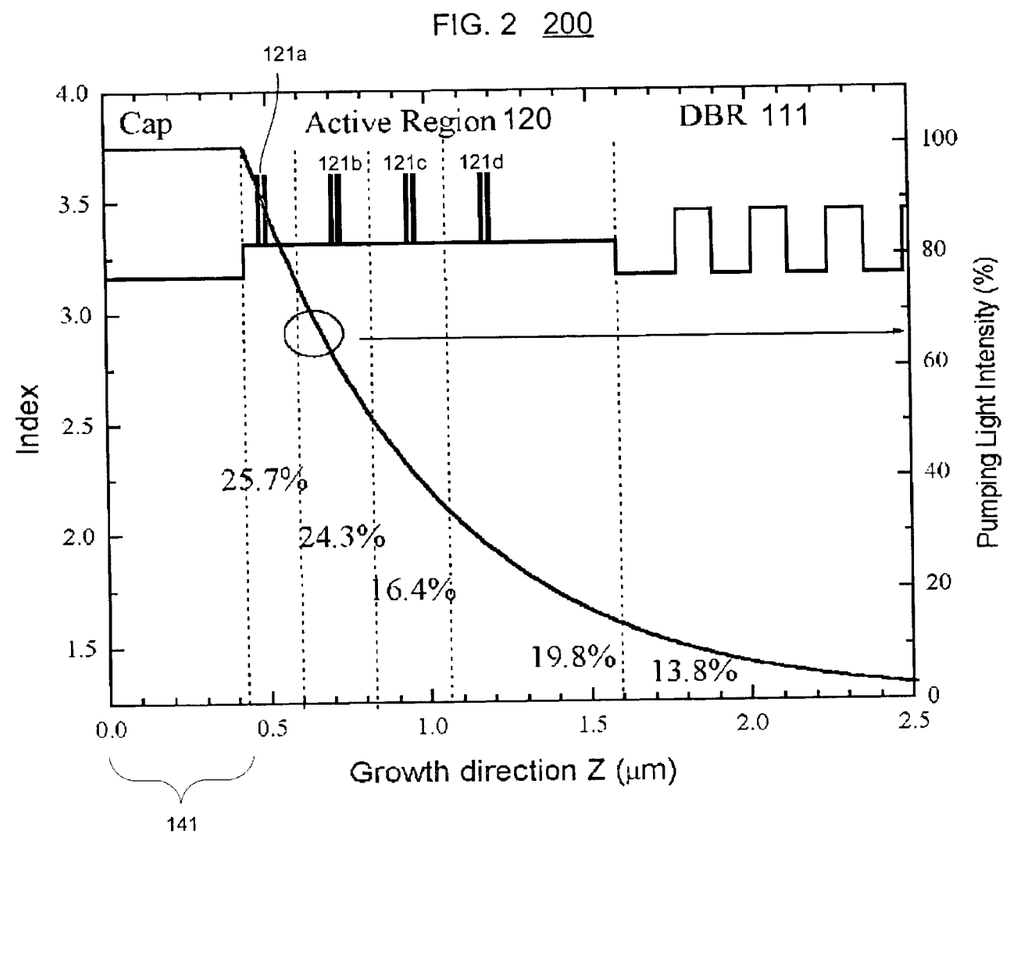
FIG. 2 is a graph plotting absorption of pump light as a function of depth into the OP VCSEL of FIG. 1.

Referring now to FIG. 2, there is shown a graph 200 plotting absorption of pump light as a function of depth into the OP VCSEL 100 of FIG. 1, with VCSEL 100 having the parameters indicated in the embodiment of Table 1. The absorption of pump light is indicated by the intensity of remaining pump light. As can be seen, 100% of the original pump light 162 remains as the light passes through cap layer 141, because it is substantially transparent to the pump light (as is thermal layer 142, not shown in FIG. 2). About 25.7% of the original light is absorbed by the initial absorbing layer 122a and by the half of intermediate absorbing layer 122b adjacent to QW group 121a, to generate carriers for QW group 121a. The absorbing layer material that generates carriers for the QW group 121b, i.e. the bottom half of absorbing layer 122b and the top half of absorbing layer 122c (those adjacent and surrounding QW group 121b), absorbs about 24.3% of the original light intensity. Another 16.4% is absorbed by absorbing material that generate carriers for QW group 121c, and the last QW group 121d receives carriers generated from absorption of about 19.8% of the light. About 13.8% of the light does not generate carriers, but passes into DBR 111.

Thus, the percentages of the pump light distributed across the four QW groups 121a, 121b, 121c, and 121d, are 25.7%, 24.3%, 16.4%, and 19.8%, respectively. Statistics for these four percentages are: mean=21.6; standard deviation=4.26; hi=25.7, low=16.4; median=22.1; average absolute deviation from median=3.45. Thus, there is a substantially uniform distribution of pumping power across the QW groups.

Figure 3:
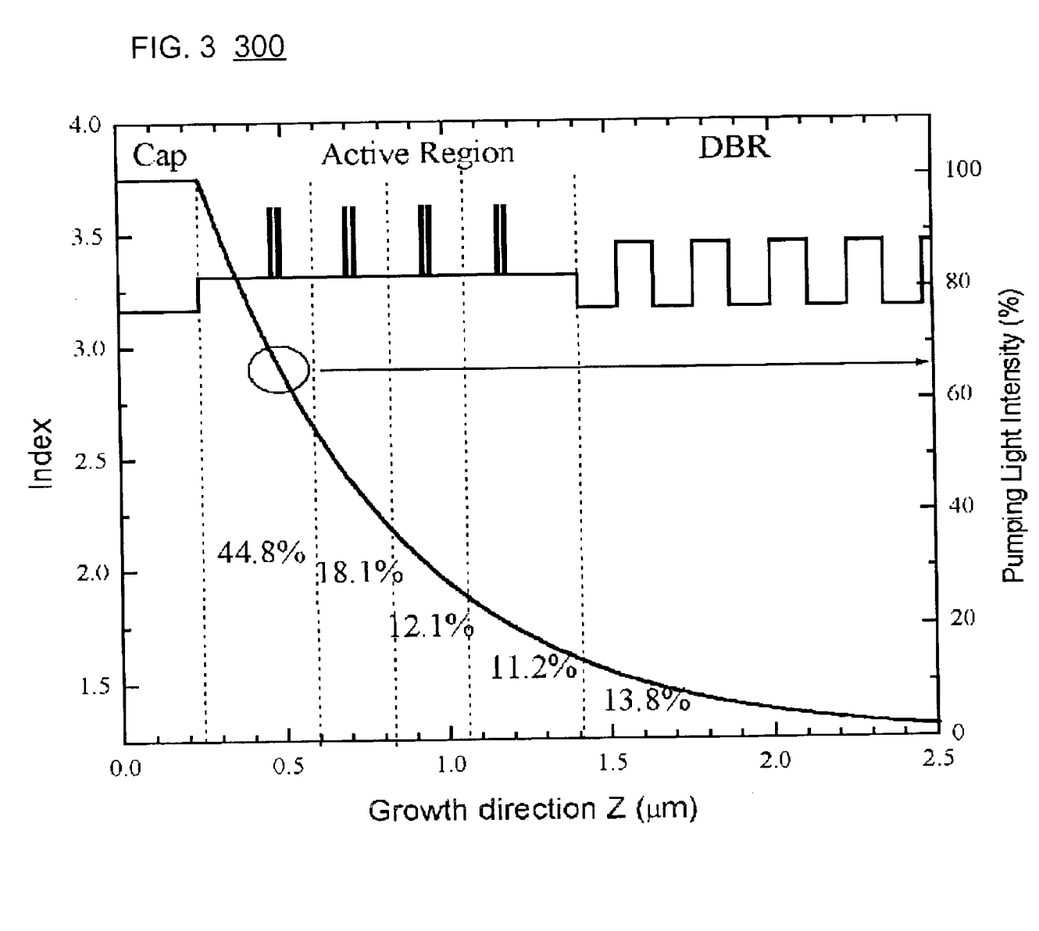
FIG. 3 is a graph plotting absorption of pump light as a function of depth into an OP VCSEL having a less uniform distribution of pumping power than the OP VCSEL of the present invention.

For comparison, Table 2 is provided below, which illustrates the layer structure of an OP VCSEL 500 that does not have the pump-power uniformity causing features of the OP VCSEL of the present invention, shown at the same initial stage of fabrication as that shown in Table 1.

that generate carriers for QW group 521c, and the last QW group 521d receives carriers generated from absorption of about 11.2% of the light. As with VCSEL 100 of the present invention having the parameters specified in Table 1, about 13.8% of the light does not generate carriers, but passes into the VCSEL's DBR.

Thus, the percentages of the pump light distributed across the four QW groups 521a, 521b, 521c, and 521d, are 44.8%, 18.1%, 11.2%, and 12.1%, respectively. Statistics for these four percentages are: mean=21.5; standard deviation=15.8; hi=44.8, low=11.2; median=15.1; average absolute deviation from median=9.90. The VCSEL 500 of Table 2 has a

TABLE 2

| Layer # | Layer Name | Materials | Thickness (Å) | Nominal thickness |
|---|---|---|---|---|
| 514 | Phase | InP | 823.6 | |
| 511 | DBR | $In_{0.527}Ga_{0.334}Al_{0.139}As$/InP pairs | 1122/1124 (×24 pairs) | ($\lambda$/4 × 2)/pair × 24 pairs = $\lambda$/4 × 48 = 12$\lambda$ |
| 522e | Absorbing | $In_{0.82}Ga_{0.19}As_{0.395}P_{0.605}$ (1.18 $\mu$m) | 1169.4 | $\lambda$/4 |
| 522e | Absorbing | $In_{0.82}Ga_{0.19}As_{0.395}P_{0.605}$ (1.18 $\mu$m) | 1007.0 | 4$\lambda$/2 |
| 521d | QW4B | $In_{0.72}Ga_{0.28}$AsP QW (≈0.8% str) | 80.0 | |
| 523d | Barrier | $In_{0.82}Ga_{0.18}$AsP (≈0.5% t. str) | 150.0 | |
| 521d | QW4A | $In_{0.72}Ga_{0.28}$AsP QW (≈0.8% str) | 80.0 | |
| 522d | Absorbing | $In_{0.82}Ga_{0.19}As_{0.395}P_{0.605}$ (1.18 $\mu$m) | 2014.0 | |
| 521c | QW3B | $In_{0.72}Ga_{0.28}$AsP QW (≈0.8% str) | 80.0 | |
| 523c | Barrier | $In_{0.82}Ga_{0.18}$AsP (≈0.5% t. str) | 150.0 | |
| 521c | QW3A | $In_{0.72}Ga_{0.28}$AsP QW (≈0.8% str) | 80.0 | |
| 522c | Absorbing | $In_{0.82}Ga_{0.19}As_{0.395}P_{0.605}$ (1.18 $\mu$m) | 2014.0 | |
| 521b | QW2B | $In_{0.72}Ga_{0.28}$AsP QW (≈0.8% str) | 80.0 | |
| 523b | Barrier | $In_{0.82}Ga_{0.18}$AsP (≈0.5% t. str) | 150.0 | |
| 521b | QW2A | $In_{0.72}Ga_{0.28}$AsP QW (≈0.8% str) | 80.0 | |
| 522b | Absorbing | $In_{0.82}Ga_{0.19}As_{0.395}P_{0.605}$ (1.18 $\mu$m) | 2014.0 | |
| 521a | QW1B | $In_{0.72}Ga_{0.28}$AsP QW (≈0.8% str) | 80.0 | |
| 523a | Barrier | $In_{0.82}Ga_{0.18}$AsP (≈0.5% t. str) | 150.0 | |
| 521a | QW1A | $In_{0.72}Ga_{0.28}$AsP QW (≈0.8% str) | 80.0 | |
| 522a | Absorbing | $In_{0.82}Ga_{0.19}As_{0.395}P_{0.605}$ (1.18 $\mu$m) | 422.3 | |
| 522a | Absorbing | $In_{0.82}Ga_{0.19}As_{0.395}P_{0.605}$ (1.18 $\mu$m) | 1169.4 | $\lambda$/4 |
| 541 | Cap | InP | 2448 | $\lambda$/2 |
| 542 | Thermal | InP | 19584 | 4$\lambda$ |
| 553 | Etch-stop | $In_{0.53}Ga_{0.47}As$ | 3000 | |
| 552 | Buffer | InP | 3000 | |
| 551 | Substrate | InP | large | |

The VCSEL 500 of Table 2 has absorbing initial layers 522a that are 1591.7 Å thick, which is comparable to the thickness of the intermediate layers, and not significantly thinner than all other absorbing layers. The VCSEL 500 of Table 2 has less absorbing material 522e after the last QW group 521d than does VCSEL 100 of Table 1 (2176.4 Å for VCSEL 500 versus 3930.5 Å for VCSEL 100, Table 1).

Referring now to FIG. 3, there is shown a graph 300 plotting absorption of pump light intensity as a function of depth into the OP VCSEL of Table 2, which has a less uniform distribution of pumping power than the OP VCSEL of the present invention. As with graph 200 of FIG. 2, the absorption of pump light in graph 300 is indicated by the intensity of remaining pump light. As can be seen, 100% of the original pump light remains as the light passes through the cap layer, because it is substantially transparent to the pump light. About 44.8% of the original light is absorbed by the initial absorbing layer 522a and by the half of intermediate absorbing layer 522b adjacent to the first QW group 521a, to generate carriers for QW group 521a. The absorbing layer material that generates carriers for the QW group 521b, i.e. the bottom half of absorbing layer 522b and the top half of absorbing layer 522c (those adjacent and surrounding QW group 521b), absorbs about 18.1% of the original light intensity. Another 12.1% is absorbed by absorbing material significantly less uniform distribution of pumping power across the QW groups than does the VCSEL of the present invention (e.g., standard deviation of 15.8 compared to 4.26). Accordingly, by employing an initial absorbing region that is significantly thinner than remaining absorbing layers of the MQW active region, the pump power distribution uniformity across QW groups is improved.

The MQW active region having improved pump power distribution uniformity may be employed, in general, in semiconductor-based optoelectronic devices, such as OP VCSELs, as in the embodiments described herein, or in other semiconductor-based optoelectronic devices, such as optical amplifiers. For example, an optical amplifier similar to the structure of OP VCSEL 100 of FIG. 1, but omitting the bottom mirror sections 112, 111, 114 and providing a transparent substrate 101 and making other suitable modifications, could employ the improved MQW active region of the present invention. For example, 980 nm pump light 162 could be used, as illustrated in FIG. 1, to pump the active region; then, for example, less-intense 1.55 $\mu$m light to be amplified could be directed through the active region (either into the bottom or into the top), where it would be amplified by the active region.

The present invention, therefore, provides an OP MQW active region for use in an optical cavity of an OP VCSEL, which VCSEL is for generating laser light at a lasing wavelength and is adapted to receive pump light at a first end of the optical cavity. The OP MQW active region comprises a plurality of quantum well (QW) groups (121), each having one or more QWs, where the QW groups are equally spaced within the active region to correspond in position with antinodes of a standing wave of the lasing wavelength laser radiation that exists in the optical cavity during operation of the OP VCSEL. The QW groups comprise a first QW group (121a) closest to the first end of the optical cavity, and a last QW group (121d) farthest from the first end of the optical cavity. The active region also contains a plurality of equally thick intermediate absorbing layers (122b–d) disposed between adjacent QW groups (namely, 121a and 121b; 121b and 121c; and 121c and 121d) of the plurality of QW groups; a "last" absorbing layer (122e) disposed adjacent to the side of the last QW group farthest from the first end of the optical cavity; and a first absorbing layer (122a) disposed adjacent to the side of the first QW group closest to the first end of the optical cavity, wherein the first absorbing layer has a thickness at least two times smaller than that of the intermediate absorbing layers.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. An optically-pumped (OP) multiple quantum well (MQW) active region for use in an optical cavity of an optically-pumped vertical-cavity surface-emitting laser (OP VCSEL) for generating laser light at a lasing wavelength, the OP VCSEL being adapted to receive pump light at a first end of the optical cavity, the active region comprising:
    (a) a plurality of quantum well (QW) groups equally spaced within the active region to correspond in position with antinodes of a standing wave of the lasing wavelength laser radiation that exists in the optical cavity during operation of the OP VCSEL, the plurality of QW groups comprising a first QW group closest to the first end of the optical cavity and a last QW group farthest from the first end of the optical cavity;
    (b) a plurality of equally thick intermediate absorbing layers disposed between adjacent QW groups of the plurality of QW groups;
    (c) a last absorbing layer disposed adjacent to the side of the last QW group farthest from the first end of the optical cavity; and
    (d) a first absorbing layer disposed adjacent to the side of the first QW group closest to the first end of the optical cavity, wherein the first absorbing layer has a thickness at least two times smaller than that of the intermediate absorbing layers.

2. The active region of claim 1, wherein the first absorbing layer has a thickness at least four times smaller than that of the intermediate absorbing layers.

3. The active region of claim 1, wherein the first absorbing layer has a thickness at least two times smaller than that of the intermediate absorbing layers and the last absorbing layer.

4. The active region of claim 1, wherein:
    each QW group comprises one or more InGaAsP QW layers; and
    the intermediate, first, and last absorbing layers consist of InGaAsP.

5. The active region of claim 4, wherein the absorbing layers consist of InGaAsP having a bandgap equal to the energy of photons of a wavelength of about 1.18 $\mu$m.

6. The active region of claim 4, wherein the absorbing layers consist of $In_{0.82}Ga_{0.19}As_{0.395}P_{0.605}$ and the QW layers consist of $In_{0.72}Ga_{0.28}AsP$.

7. The active region of claim 6, wherein each QW layer is about 80 Å thick, each intermediate absorbing layer is about 2014 Å thick, the last absorbing layer is at least 2014 Å thick, and the first absorbing layer is no more than 422.3 Å thick.

8. The active region of claim 7, wherein each QW group comprises a pair of $In_{0.72}Ga_{0.28}AsP$ QW layers and an $In_{0.82}Ga_{0.18}AsP$ barrier layer between the pair of QW layers, wherein each barrier layer is about 150 Å thick.

9. The active region of claim 8, wherein the QW layers have a compressive strain of about 0.8% and the barrier layers have a tensile strain of about 0.5%.

10. The active region of claim 8, wherein the lasing wavelength is about 1.55 $\mu$m.

11. The active region of claim 8, wherein the plurality of QW groups comprises exactly four QW groups and the plurality of intermediate absorbing layers comprises exactly three intermediate absorbing layers.

12. The active region of claim 4, wherein each QW layer is about 80 Å thick, each intermediate absorbing layer is about 2014 Å thick, the last absorbing layer is at least 2014 Å thick, and the first absorbing layer is no more than 422.3 Å thick.

13. The active region of claim 4, wherein each QW group comprises a pair of InGaAsP QW layers and an InGaAsP barrier layer between the pair of QW layers.

14. The active region of claim 13, wherein each QW layer is about 80 Å thick, each barrier layer is about 150 Å thick, each intermediate absorbing layer is about 2014 Å thick, the last absorbing layer is at least 2014 Å thick, and the first absorbing layer is no more than 422.3 Å thick.

15. The active region of claim 14, wherein the lasing wavelength is about 1.55 $\mu$m.

16. The active region of claim 13, wherein the QW layers have a compressive strain of about 0.8% and the barrier layers have a tensile strain of about 0.5%.

17. The active region of claim 1, wherein the lasing wavelength is about 1.55 $\mu$m.

18. The active region of claim 17, wherein the pump laser light has a wavelength of about 980 nm.

19. The active region of claim 17, wherein the absorbing layers consist of InGaAsP having a bandgap equal to the energy of photons of a wavelength of about 1.18 $\mu$m.

20. The active region of claim 1, wherein the pump laser light has a wavelength of about 980 nm.

21. The active region of claim 1, each QW group comprises a pair of QW layers and a barrier layer between the pair of QW layers for a given QW group.

22. The active region of claim 21, wherein:
    the QW layers are InGaAsP QW layers each having a thickness of about 80 Å;
    the barrier layers are InGaAsP barrier layers each having a thickness of about 150 Å;

the intermediate, first, and last absorbing layers consist of InGaAsP; and each intermediate absorbing layer is about 2014 Å thick, the last absorbing layer is at least 2014 Å thick, and the first absorbing layer is no more than 422.3 Å thick.

23. The active region of claim 22, wherein the plurality of QW groups comprises exactly four QW groups and the plurality of intermediate absorbing layers comprises exactly three intermediate absorbing layers.

24. The active region of claim 23, wherein the QW layers have a compressive strain of about 0.8% and the barrier layers have a tensile strain of about 0.5%.

25. The active region of claim 22, wherein the QW layers have a compressive strain of about 0.8% and the barrier layers have a tensile strain of about 0.5%.

26. The active region of claim 22, wherein the lasing wavelength is about 1.55 µm.

27. The active region of claim 22, wherein the absorbing layers consist of InGaAsP having a bandgap equal to the energy of photons of a wavelength of about 1.18 µm.

28. An optically-pumped vertical-cavity surface-emitting laser (OP VCSEL) for generating laser light at a lasing wavelength, the VCSEL comprising:

(a) an optical cavity adapted to receive pump light at a first end thereof;

(b) an active region having a plurality of quantum well (QW) groups equally spaced within the active region to correspond in position with antinodes of a standing wave of the lasing wavelength laser radiation that exists in the optical cavity during operation of the OP VCSEL, the plurality of QW groups comprising a first QW group closest to the first end of the optical cavity and a last QW group farthest from the first end of the optical cavity;

(c) a plurality of equally thick intermediate absorbing layers disposed between adjacent QW groups of the plurality of QW groups;

(d) a last absorbing layer disposed adjacent to the side of the last QW group farthest from the first end of the optical cavity; and (e) a first absorbing layer disposed adjacent to the side of the first QW group closest to the first end of the optical cavity, wherein the first absorbing layer has a thickness at least two times smaller than that of the intermediate absorbing layers.

29. The VCSEL of claim 28, further comprising a bottom cavity mirror disposed on the side of the active region closest to the last absorbing layer and a top cavity mirror disposed on the side of the active region closest to the first absorbing layer.

30. The VCSEL of claim 28, wherein the first absorbing layer has a thickness at least four times smaller than that of the intermediate absorbing layers.

31. The VCSEL of claim 28, wherein the first absorbing layer has a thickness at least two times smaller than that of the intermediate absorbing layers and the last absorbing layer.

32. The VCSEL of claim 28, wherein:

each QW group comprises one or more InGaAsP QW layers; and the intermediate, first, and last absorbing layers consist of InGaAsP.

33. The VCSEL of claim 32, wherein the absorbing layers consist of InGaAsP having a bandgap equal to the energy of photons of a wavelength of about 1.18 µm.

34. The VCSEL of claim 32, wherein the absorbing layers consist of $In_{0.82}Ga_{0.19}As_{0.395}P_{0.605}$ and the QW layers consist of $In_{0.72}Ga0.28AsP$.

35. The VCSEL of claim 32, wherein each QW layer is about 80 Å thick, each intermediate absorbing layer is about 2014 Å thick, the last absorbing layer is at least 2014 Å thick, and the first absorbing layer is no more than 422.3 Å thick.

36. The VCSEL of claim 35, wherein each QW group comprises a pair of $In_{0.72}G_{0.28}AsP$ QW layers and an $In_{0.82}Ga_{0.18}AsP$ barrier layer between the pair of QW layers, wherein each barrier layer is about 150 Å thick.

37. The VCSEL of claim 36, wherein the QW layers have a compressive strain of about 0.8% and the barrier layers have a tensile strain of about 0.5%.

38. The VCSEL of claim 36, wherein the lasing wavelength is about 1.55 µm.

39. The VCSEL of claim 36, wherein the plurality of QW groups comprises exactly four QW groups and the plurality of intermediate absorbing layers comprises exactly three intermediate absorbing layers.

40. The VCSEL of claim 32, wherein each QW layer is about 80 Å thick, each intermediate absorbing layer is about 2014 Å thick, the last absorbing layer is at least 2014 Å thick, and the first absorbing layer is no more than 422.3 Å thick.

41. The VCSEL of claim 32, wherein each QW group comprises a pair of InGaAsP QW layers and an InGaAsP barrier layer between the pair of QW layers.

42. The VCSEL of claim 41, wherein the QW layers have a compressive strain of about 0.8% and the barrier layers have a tensile strain of about 0.5%.

43. The VCSEL of claim 28, each QW group comprises a pair of QW layers and a barrier layer between the pair of QW layers for a given QW group.

44. The VCSEL of claim 43, wherein:

the QW layers are InGaAsP QW layers each having a thickness of about 80 Å;

the barrier layers are InGaAsP barrier layers each having a thickness of about 150 Å;

the intermediate, first, and last absorbing layers consist of InGaAsP; and each intermediate absorbing layer is about 2014 Å thick, the last absorbing layer is at least 2014 Å thick, and the first absorbing layer is no more than 422.3 Å thick.

45. The VCSEL of claim 44, wherein the plurality of QW groups comprises exactly four QW groups and the plurality of intermediate absorbing layers comprises exactly three intermediate absorbing layers.

46. The VCSEL of claim 44, wherein the QW layers have a compressive strain of about 0.8%, the barrier layers have a tensile strain of about 0.5% and the lasing wavelength is about 1.55 µm.

* * * * *